(12) United States Patent
Horie

(10) Patent No.: US 6,594,182 B1
(45) Date of Patent: Jul. 15, 2003

(54) SEMICONDUCTOR MEMORY DEVICE HAVING CONTROLLED IMPURITY CONCENTRATION PROFILE, METHOD FOR MANUFACTURING THEREOF, AND SEMICONDUCTOR MANUFACTURING APPARATUS

(75) Inventor: Yasuhiko Horie, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/193,062

(22) Filed: Jul. 12, 2002

(30) Foreign Application Priority Data

Jan. 23, 2002 (JP) ......................................... 2002-014513

(51) Int. Cl.[7] .............................................. G11C 16/04
(52) U.S. Cl. ............................ 365/185.26; 365/185.28; 257/315
(58) Field of Search ..................... 365/185.26; 257/321, 257/377, 755, 315; 438/257; 216/20; 156/603; 437/164

(56) References Cited

U.S. PATENT DOCUMENTS 5,015,327 A * 5/1991 Taguchi et al. ............. 156/603
5,173,440 A * 12/1992 Tsunashima et al. ........ 437/164
5,437,762 A * 8/1995 Ochiai et al. ................ 216/20
6,153,470 A * 11/2000 He et al. ..................... 438/257
6,455,890 B1 * 9/2002 Chang et al. ................ 257/321

FOREIGN PATENT DOCUMENTS

| JP | 64-059869 | 3/1989 |
| JP | 2000-195973 | 7/2000 |

OTHER PUBLICATIONS

Japanese patent JP403035564A by Ikegami,Masami I.*

Japanese patent JP355003378A by Abe, Haruhiko I.*

* cited by examiner

*Primary Examiner*—David Nelms
*Assistant Examiner*—Thinh T. Nguyen
(74) *Attorney, Agent, or Firm*—Burns, Doane, Swecker & Mathis, LLP

(57) ABSTRACT

A tunnel gate insulating film is formed on a substrate. Next, a floating gate electrode containing no impurities in the vicinities of upper and lower end surfaces is formed on the tunnel gate insulating film. Then, the surface of the floating gate electrode is thermally oxidized to form a poly-gate oxide film.

6 Claims, 2 Drawing Sheets

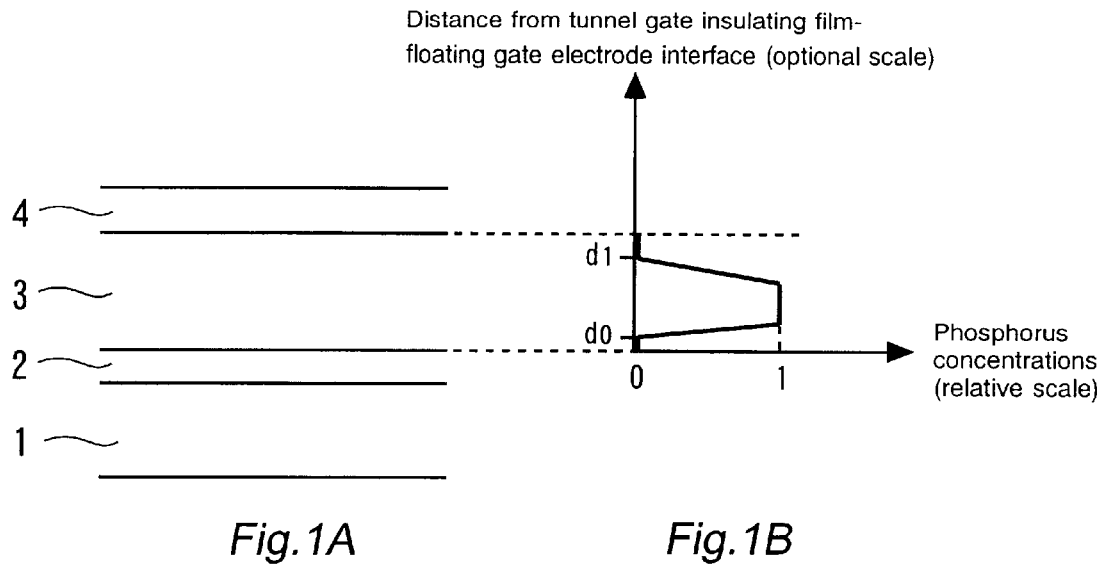
*Fig.1A*      *Fig.1B*
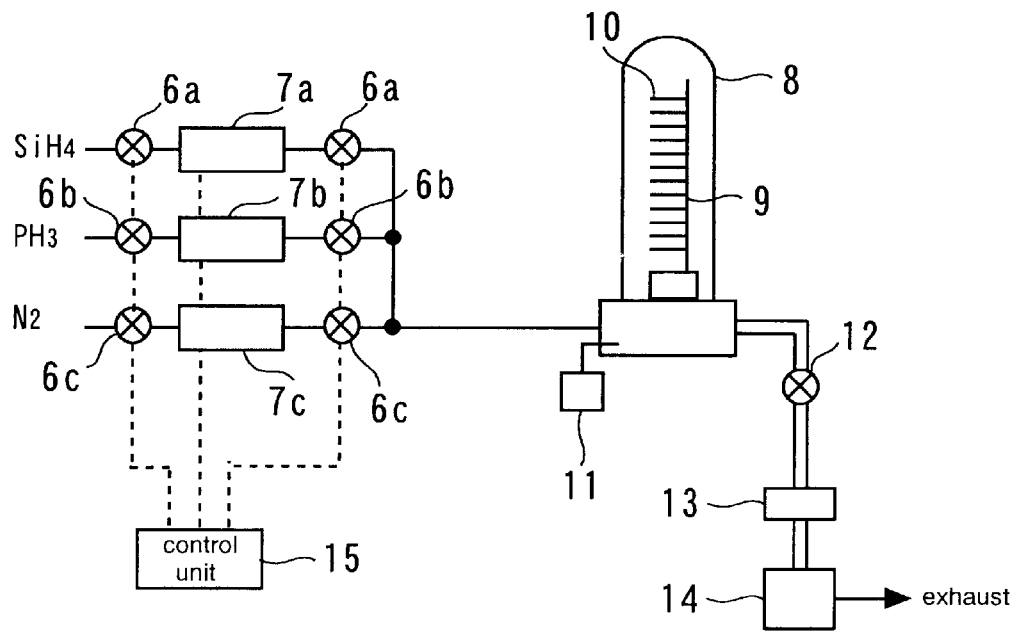
*Fig.2*

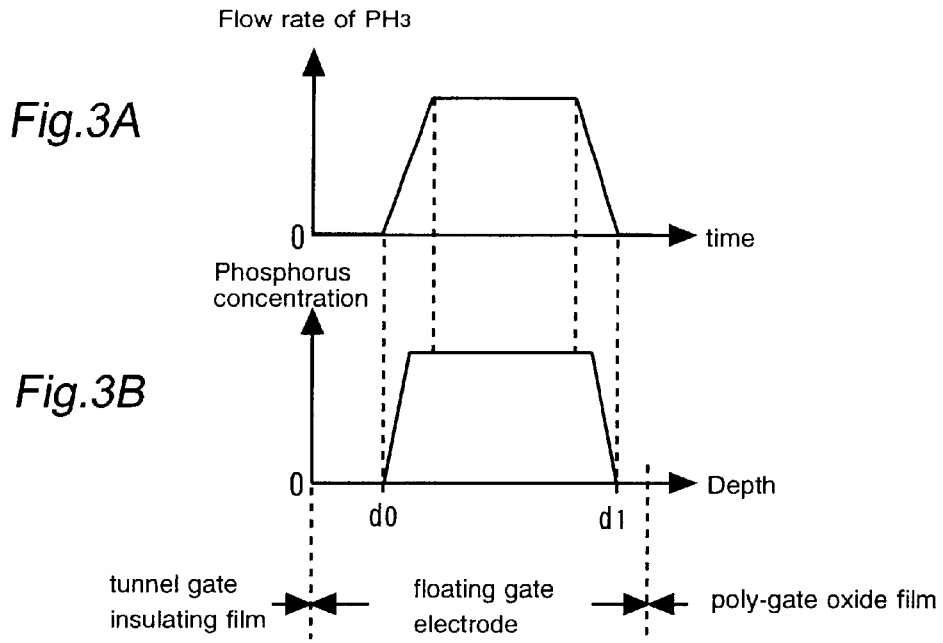
Fig.3A
Fig.3B
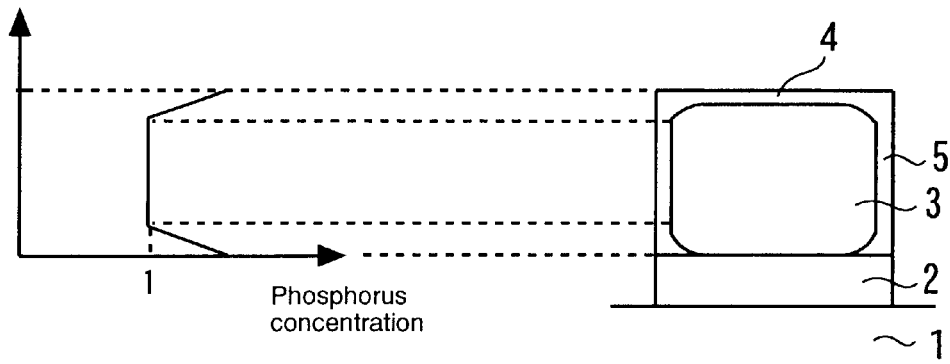
Fig.4A   Fig.4B

SEMICONDUCTOR MEMORY DEVICE HAVING CONTROLLED IMPURITY CONCENTRATION PROFILE, METHOD FOR MANUFACTURING THEREOF, AND SEMICONDUCTOR MANUFACTURING APPARATUS

BACKGROUND OF THE INVENTION

1. Field of the Invention

The present invention relates to a non-volatile semiconductor memory device, such as a flash memory, and more specifically, to the control of phosphorus concentration profiles in a floating gate electrode.

2. Description of the Background Art

A non-volatile semiconductor memory device, such as a flash memory, (hereafter simply referred to as "semiconductor memory device") comprises an insulating film between a floating gate electrode and a control gate electrode, such as a laminated film (ONO film) consisting of the silicon oxide film ($SiO_2$ film) /silicon nitride film ($Si_3N_4$ film)/silicon oxide film ($SiO_2$ film). In the laminated film (e.g., ONO film), the film known as a poly-gate oxide film ($SiO_2$ film) on the floating gate electrode is generally formed by the thermal oxidation of the surface of the floating gate electrode.

In the thermal oxidation, the forming rate of the poly-gate oxide film, that is, the oxidation rate of the floating gate electrode increases in parallel to the phosphorus concentration of the floating gate electrode. Therefore, there has been a problem that it is difficult to form a thin poly-gate oxide film with a high accuracy while maintaining a predetermined high concentration of phosphorus.

Also, there has been a problem that phosphorus in the floating gate electrode segregates on the located underneath the floating gate electrode, resulting in the degradation of write/erase repetition characteristics of the flash memory.

As a first method for solving the above-described problems, there is proposed a method for forming a polysilicon film containing no impurities on a polysilicon film containing a high concentration of thermally diffused phosphorus, for example, as disclosed in Japanese Patent Laid-Open No. 64-59869.

As a second method, there is proposed a method for forming a polysilicon films having different phosphorus concentrations through an impurity diffusion controlling film, as disclosed in Japanese Patent Laid-Open No. 2000-195973.

In the two above-described methods, however, there has been a problem that the number of manufacturing steps increases since the formation of the floating gate electrode is discontinuous. Also, there has been a problem that the quality of the floating gate electrode is deteriorated by the contamination by organic compounds contained in the atmosphere of a clean room, or by the formation of natural oxide films.

Also, on the oxidation of the sidewall of the floating gate electrode performed after the formation of the control gate electrode, the source and the drain, the quantity of oxidation could not be controlled. In other words, the thickness of the sidewall oxide film that covers the sidewall of the floating gate electrode could not be controlled. Therefore, there has been a problem that the electric field concentration occurs in the edge (corner) of the floating gate electrode, and the reliability of the tunnel gate insulating film lowers. This problem could not be solved by any of the above-described methods.

SUMMARY OF THE INVENTION

The present invention has been conceived to solve the previously-mentioned problems and a general object of the present invention is to provide a novel and useful semiconductor memory device, and is to provide a novel and useful method for manufacturing semiconductor memory device, and is to a novel and useful semiconductor manufacturing apparatus.

A more specific object of the present invention is to control the distribution of impurity concentrations in the floating gate electrode of the semiconductor memory device, and to improve device characteristics.

The above object of the present invention is attained by a following semiconductor memory device, and by a following method for manufacturing semiconductor memory device, and by a following semiconductor manufacturing apparatus.

According to first aspect of the present invention, the semiconductor memory device comprises a tunnel gate insulating film formed on a substrate. A floating gate electrode is formed on the tunnel gate insulating film, the floating gate electrode containing no impurities in the vicinities of the upper and lower end surfaces of the floating gate electrode. An insulating film is formed on the floating gate electrode.

According to second aspect of the present invention, in the method for manufacturing a semiconductor memory device, a tunnel gate insulating film is formed on a substrate. A floating gate electrode is formed on the tunnel gate insulating film so that the floating gate electrode contains no impurities in the vicinities of the upper and lower end surfaces of the floating gate electrode. An insulating film is formed on the floating gate electrode.

According to third aspect of the present invention, the semiconductor manufacturing apparatus for forming a floating gate electrode on a substrate comprises a first supplying section for supplying a material gas containing no impurities. A second supplying section supply a gas containing an impurity. A control unit controls the first supplying section and the second supplying section, the control unit controlling the second supplying section to change the flow rate of the gas containing the impurity when the floating gate electrode is formed.

Other objects and further features of the present invention will be apparent from the following detailed description when read in conjunction with the accompanying drawings.

BRIEF DESCRIPTION OF THE DRAWINGS

FIG. 1A is a sectional view showing the structure of a semiconductor memory device according to First Embodiment of the present invention;

FIG. 1B is a graph showing the distribution of phosphorus concentration in the floating gate electrode according to First Embodiment of the present invention;

FIG. 2 is a conceptual diagram for illustrating an apparatus for manufacturing a semiconductor memory device which forms the floating gate electrode according to First Embodiment of the present invention;

FIG. 3A is a graph showing change in the flow rate of $PH_3$ gas according to First Embodiment of the present invention;

FIG. 3B is a graph showing the distribution of phosphorus concentration in the floating gate electrode according to First Embodiment of the present invention;

FIG. 4A is a graph showing phosphorus concentrations in a floating gate electrode according to Second Embodiment of the present invention; and FIG. 4B is a diagram showing the structure of the semiconductor memory device according to Second Embodiment of the present invention.

DETAILED DESCRIPTION OF THE PREFERRED EMBODIMENTS

In the following, principles and embodiments of the present invention will be described with reference to the accompanying drawings. The members and steps that are common to some of the drawings are given the same reference numerals and redundant descriptions therefore may be omitted.

First Embodiment

FIGS. 1A and 1B show diagrams for illustrating a semiconductor memory device according to First Embodiment of the present invention. More specifically, FIG. 1A is a sectional view showing the structure of a semiconductor memory, and FIG. 1B is a graph showing the distribution of phosphorus concentration in the floating gate electrode shown in FIG. 1A.

In FIGS. 1A and 1B, reference numeral 1 denotes a substrate, such as a silicon substrate and an insulating substrate, 2 denotes a tunnel gate insulating film formed on the substrate 1, 3 denotes a floating gate electrode formed on the tunnel gate insulating film, 4 denotes a poly-gate oxide film formed on the floating gate electrode 3.

The abscissa in FIG. 1B indicates phosphorus concentrations (relative scale), and the ordinate indicates the distance from the interface of the tunnel gate insulating film 2 and the floating gate electrode 3 (optional scale). Reference numerals d0 and d1 denote the depth where the phosphorus concentration in the floating gate electrode 3 becomes zero.

As FIGS. 1A and 1B show, the floating gate electrode 3 has a distribution of phosphorus concentrations that are zero at the upper and lower end surfaces, and a predetermined concentration at the central portion. The phosphorus concentrations vary continuously from d0 to d1 of the floating gate electrode 3. Here, the upper end surface is the interface of the floating gate electrode 3 and the poly-gate oxide film 4; and the lower end surface is the interface of the floating gate electrode 3 and the tunnel gate insulating film 2.

Next, a method for manufacturing the above-described semiconductor memory device will be described below referring to FIGS. 1A and 1B.

First, the tunnel gate insulating film 2 having a thickness of 8.0 nm to 11.0 nm is formed on the substrate 1.

Then, a floating gate electrode 3, which has a thickness of 100 nm to 200 nm and has the distribution of phosphorus concentrations that are zero in the vicinities of the upper and lower end surfaces, that is, a floating gate electrode 3 containing no impurities in the vicinities of the upper and lower end surfaces, is formed on the tunnel gate insulating film 2 using LPCVD (low pressure chemical vapor deposition). This will be described in more detail later.

Next, the surface of the floating gate electrode 3 is thermally oxidized to form a poly-gate oxide film 4 by a thickness of 1.0 nm to 6.0 nm on the floating gate electrode 3. Here, the forming rate of the poly-gate oxide film 4, that is, the oxidation rate of the floating gate electrode 3, has a positive correlation (direct proportion) to the concentration of phosphorus contained in the floating gate electrode 3. Therefore, when the floating gate electrode 3 has the impurity concentration distribution as FIG. 1B shows, in other words, when the phosphorus concentration at the upper end surface of the floating gate electrode 3 is zero, the forming rate of the poly-gate oxide film 4 is lowered. Therefore, when the poly-gate oxide film 4 is formed as a thin film, the film-thickness control characteristics are improved.

Also, if the depth d1, where the phosphorus concentration at the upper end surface of the floating gate electrode 3 is zero, is designed to be larger than the thickness of the poly-gate oxide film 4 formed by thermal oxidation, the phosphorus concentration in the poly-gate oxide film 4 formed by thermal oxidation can be zero. Therefore, a poly-gate oxide film 4 of a high quality can be formed. Here, it is preferable to design the depth d1 to be 1.5 to 2.0 times the thickness of the poly-gate oxide film 4.

Next, an apparatus for manufacturing the above-described floating gate electrode 3 will be described.

FIG. 2 is a conceptual diagram for illustrating an apparatus for manufacturing a semiconductor memory device which forms the floating gate electrode 3 according to First Embodiment of the present invention.

First, the constitution of the apparatus for manufacturing a semiconductor memory device will be described.

In FIG. 2, reference numerals and characters 6a, 6b, and 6c denote valves installed in an $SiH_4$ gas line, a $PH_3$ gas line, and an $N_2$ gas line, respectively; 7a, 7b, and 7c denote mass-flow controllers for controlling the flow rate of the gases; 8 denotes a reaction chamber; 9 denotes a wafer boat; 10 denotes a silicon wafer as a substrate to be processed held on the wafer boat 9; 11 denotes a pressure sensor for measuring the pressure in the reaction chamber 8; 12 denotes an exhaust valve; 13 denotes a pressure control unit for controlling the pressure in the reaction chamber 8; and 14 denotes a vacuum pump.

The semiconductor manufacturing apparatus also comprises a control unit 15 for controlling opening and closing of the valves 6a, 6b and 6c, and for controlling the mass-flow controllers 7a, 7b and 7c. The control unit 15 can change the flow rate of $PH_3$ gas on the formation of the floating gate electrode. Also, the semiconductor manufacturing apparatus comprises a heating mechanism (not shown) for heating the reaction chamber 8 to a predetermined temperature.

Although not shown, the pressure sensor 11, the exhaust valve 12, the pressure control unit 13, and the vacuum pump 14 are connected to the control unit 15 through signal lines and controlled.

Next, the operation of the above-described semiconductor manufacturing apparatus will be described below. Specifically, a method for forming the floating gate electrode using the above-described semiconductor manufacturing apparatus will be described. FIG. 3 shows graphs for describing a method for forming the floating gate electrode 3 in First Embodiment. Specifically, FIG. 3A is a graph showing change in the flow rate of $PH_3$ gas, and FIG. 3B is a graph showing the distribution of phosphorus concentration in the floating gate electrode 3.

First, a silicon wafer 10 is held on a wafer boat 9, and the wafer boat 9 is moved into the reaction chamber 8. Thereby, the silicon wafer 10 is transferred to and held in the reaction chamber 8.

Next, the exhaust valve 12 is opened, and the reaction chamber 8 is evacuated using a vacuum pump 14. Then, the pressure in the reaction chamber 8 is controlled to a predetermined pressure using the pressure sensor 11 and the pressure control unit 13. Further, the reaction chamber 8 is heated to a temperature between 500° C. and 800° C. by the heating mechanism.

Next, the valve 6a of the SiH₄ gas line is opened, and at the same time, SiH₄ gas is supplied in the reaction chamber 8 under the control of the mass-flow controller 7a. The SiH₄ gas is diluted to a predetermined concentration by a diluting gas (N₂ gas) supplied under the control of the valve 6c and the mass-flow controller 7c. Thereby, a polysilicon film containing no phosphorus is formed on the silicon wafer 10.

After a predetermined time has passed, that is, after the thickness of the above-described polysilicon film containing no phosphorus has become a predetermined thickness, the valve 6b of the PH₃ gas line is opened to supply the PH₃ gas into the reaction chamber 8. The valve 6a of the SiH₄ gas line is still kept open. Here, as FIG. 3A shows, the flow rate of the PH₃ gas is continuously changed (increased) from zero to a predetermined flow rate under the control of the mass-flow controller 7a. Thereby, as FIG. 3B shows, the concentration of phosphorus contained in the polysilicon film is continuously changed (increased) from zero to a predetermined value.

Furthermore, after a predetermined time has passed, that is, after the thickness of the polysilicon film containing phosphorus has become a predetermined thickness, as FIG. 3A shows, the flow rate of the PH₃ gas is continuously changed (decreased) from the predetermined flow rate to zero under the control of the mass-flow controller 7a. Thereby, as FIG. 3B shows, the concentration of phosphorus contained in the polysilicon film is continuously changed (decreased) from the predetermined value to zero. Thereafter, the valve 6b of the PH₃ gas line is closed.

Then, after a predetermined time has passed, that is, after the thickness of the polysilicon film containing no phosphorus has become a predetermined thickness, the valves 6a and 6c are closed.

According to First Embodiment, as described above, the distribution of phosphorus concentration in the floating gate electrode 3 can be controlled. In other words, the concentration of phosphorus contained in the floating gate electrode 3 can be made zero in the interface of the floating gate electrode 3 and the tunnel gate insulating film 2. Therefore, the segregation of phosphorus contained in the floating gate electrode 3 to the tunnel gate insulating film 2 can be inhibited, and the degradation of the tunnel gate insulating film 2 can be inhibited. Therefore, the write/erase repetition characteristics of the flash memory, that is, the device characteristics can be improved.

Also, in the interface of the floating gate electrode 3 and the poly-gate oxide film 4, the phosphorus concentration in the floating gate electrode 3 can be made zero. Therefore, the oxidation rate of the poly-gate oxide film 4 can be retarded. Therefore, a thin poly-gate oxide film 4 can be formed very accurately. Thereby, device characteristics can be improved.

Although a batch-type CVD apparatus is used as the semiconductor manufacturing apparatus in First Embodiment, a single-wafer-processing CVD apparatus may also be used. Also, although phosphorus is used as an impurity in the floating gate electrode 3 in First Embodiment, impurities such as arsenic and boron may also be used.

The thicknesses of the tunnel gate insulating film 2, the floating gate electrode 3, and the poly-gate oxide film 4; and the depth dl shown herein are only examples, and the present invention is not limited to these values as long as the effect of the present application can be obtained.

Second Embodiment

FIG. 4 shows diagrams for illustrating a semiconductor memory device according to Second Embodiment of the present invention. Specifically, FIG. 4A is a graph showing phosphorus concentrations in a floating gate electrode, and FIG. 4B is a diagram showing the structure of the semiconductor memory device.

In FIGS. 4A and 4B, reference numeral 1 denotes a substrate, 2 denotes a tunnel gate insulating film, 3 denotes a floating gate electrode, 4 denotes a poly-gate oxide film, and 5 denotes a sidewall oxide film.

The floating gate electrode 3 has a phosphorus concentration distribution as shown in FIG. 4A. Namely, the floating gate electrode 3 has a phosphorus concentration distribution in which the phosphorus concentration is highest at the upper and lower end surfaces thereof. Here, the upper end surface is the interface of the floating gate electrode 3 and the poly-gate oxide film 4; and the lower end surface is the interface of the floating gate electrode 3 and the tunnel gate insulating film 2.

The sidewall oxide film 5 has a largest thickness in the vicinities of the upper and lower end surfaces on the sidewall of the floating gate electrode 3.

Next, a method for manufacturing the above-described semiconductor memory device will be described below referring to FIGS. 4A and 4B.

First a tunnel gate insulating film 2 is formed on a substrate 1.

Next, a floating gate electrode 3 having a phosphorus concentration distribution in which the phosphorus concentration is highest in the vicinities of the upper and lower end surfaces is formed on the tunnel gate insulating film 2 using LPCVD (low pressure chemical vapor deposition). This will be described in more detail later.

Then, the surface of the floating gate electrode 3 is thermally oxidized to form a poly-gate oxide film 4 as an insulating film on the floating gate electrode 3.

Next, although not shown, an insulating film is formed on the poly-gate oxide film 4. Here, the insulating film is a laminated film consisting of, for example, a silicon nitride film and a silicon oxide film.

Then a control gate electrode is formed on the insulating film. Furthermore, the control gate electrode, the insulating film having the poly-gate oxide film 4, the floating gate electrode 3, and the tunnel gate insulating film 2 are patterned using lithography technique. Then, a source/drain region (not shown) is formed on the surface layer of the substrate 1 using the patterned films as a mask.

Furthermore, the sidewall of the floating gate electrode 3 is thermally oxidized. Thereby, a sidewall oxide film 5 is formed on the sidewall of the floating gate electrode 3. Here, as FIG. 4B shows, the thickness of the sidewall oxide film 5 is largest in the vicinities of the upper and lower end surfaces of the floating gate electrode 3.

Next, a method for forming the floating gate electrode 3 using semiconductor manufacturing apparatus will be described referring to FIG. 2.

First, in the same manner as in First Embodiment, a silicon wafer 10 is held in the reaction chamber 8. Then, the pressure in the reaction chamber 8 is controlled to a predetermined value, and the reaction chamber 8 is heated to a temperature between 500° C. and 800° C.

Next, the valves 6a, 6b, and 6c are opened, and at the same time, SiH₄ gas of a predetermined flow rate (predetermined concentration), PH₃ gas of a high flow rate (high concentration), and diluting gas (N₂ gas) are supplied into the reaction chamber 8 under the control of the mass-flow controllers 7a, 7b, and 7c. Thereby, as FIG. 4A shows, a polysilicon film containing a high concentration of phosphorus is formed immediately above the tunnel gate insulating film 2. Here, the flow rate of the $SiH_4$ gas is, for example, 500 to 2,000 sccm, and the flow rate of the $PH_3$ gas is, for example, 500 to 2,000 sccm, and the flow rate of the $PH_3$ gas is, for example, 10% to 20% higher than a predetermined flow rate (30 to 200 sccm) described later.

Then, the flow rate of the $PH_3$ gas is gradually lowered to a predetermined flow rate, for example, 30 to 200 sccm. In this time, the flow rates of the $SiH_4$ gas and the $N_2$ gas are maintained constant. Thereby, as FIG. 4A shows, the phosphorus concentration in the polysilicon film is gradually lower in the higher locations.

After a predetermined time has passed, that is, after a predetermined thickness of a polysilicon film containing a low concentration of phosphorus has been formed, the flow rate of the $PH_3$ gas is gradually raised. In this time also, the flow rates of the $SiH_4$ gas and the $N_2$ gas are maintained constant. Thereby, as FIG. 4A shows, the phosphorus concentration in the polysilicon film is gradually higher in the higher locations.

Then, the valves 6a, 6b, and 6c are closed. Thereby, the phosphorus concentration in the surface layer of the polysilicon film (floating gate electrode) becomes highest.

By the above-described process, the floating gate electrode 3 having the highest impurity concentration in the vicinities of the upper and lower end surfaces is formed.

According to Second Embodiment, as described above, the distribution of the phosphorus concentration in the floating gate electrode 3 can be controlled. In other words, the phosphorus concentration in the floating gate electrode 3 can be maximized in the vicinity of the interface of the floating gate electrode 3 and the tunnel gate insulating film 2 and in the vicinity of the interface of the floating gate electrode 3 and the poly-gate oxide film 4. Thereby, the thickness of the sidewall oxide film 5 becomes largest in the vicinities of the upper and lower end surfaces of the floating gate electrode 3. Thus, the thickness of the sidewall oxide film 5 that covers the sidewall of the floating gate electrode 3 can be controlled.

Therefore, since electric field concentration in the edge (corner) of the floating gate electrode 3 can be reduced, the reliability of the tunnel gate insulating film 2 can be improved, and device characteristics can be improved.

The flow rates of the $SiH_4$ gas and the $PH_3$ gas described in Second Embodiment are exemplified values, and these may be changed depending on the process conditions.

Also, to summarize the above-described semiconductor memory device, the semiconductor memory device comprises: a tunnel gate insulating film formed on a substrate; a floating gate electrode formed on the tunnel gate insulating film, the impurity concentration of the floating gate electrode being highest in the vicinities of the upper and lower end surfaces of the floating gate electrode; and a sidewall oxide film covering the sidewall of the floating gate electrode, the thickness of the sidewall oxide film being largest in the vicinities of the upper and lower end surfaces of the sidewall of the floating gate electrode. In the semiconductor memory device, the sidewall oxide film is a thermal oxide film.

Also, to summarize the above-described method for manufacturing a semiconductor memory device, the method for manufacturing a semiconductor memory device comprises the steps of: forming a tunnel gate insulating film on a substrate; forming a floating gate electrode on the tunnel gate insulating film, impurity concentration of the floating gate electrode being highest in the vicinities of the upper and lower end surfaces of the floating gate electrode; patterning the floating gate electrode; and forming a sidewall oxide film so as to cover the sidewall of the patterned floating gate electrode. In the method, the step of forming the floating gate electrode comprises steps of: supplying a material gas containing no impurities and a gas containing an impurity; gradually decreasing the flow rate of the gas containing the impurity; gradually increasing the flow rate of the gas containing the impurity; and stopping the supply of the material gas and the gas containing the impurity. In the method, the step of forming the sidewall oxide film is the thermal oxidation of the sidewall of the floating gate electrode.

This invention, when practiced illustratively in the manner described above, provides the following major effects:

According to the present invention, the impurity concentration in the floating gate electrode can be controlled, and device characteristics can be improved.

Further, the present invention is not limited to these embodiments, but variations and modifications may be made without departing from the scope of the present invention.

The entire disclosure of Japanese Patent Application No. 2002-014513 filed on Jan. 23, 2002 containing specification, claims, drawings and summary are incorporated herein by reference in its entirety.

What is claimed is:

1. A semiconductor memory device comprising:
   a tunnel gate insulating film formed on a substrate;
   a floating gate electrode formed on said tunnel gate insulating film, said floating gate electrode containing no impurities in vicinities of upper and lower end surfaces of said floating gate electrode and an impurity concentration that varies continuously between zero and a predetermined amount therebetween; and
   an insulating film formed on said floating gate electrode.

2. A method for manufacturing a semiconductor memory device comprising the steps of:
   forming a tunnel gate insulating film on a substrate;
   forming a floating gate electrode on the tunnel gate insulating film so that the floating gate electrode contains no impurities in vicinities of upper and lower end surfaces of the floating gate electrode and an impurity concentration that varies continuously between zero and a predetermined amount therebetween; and
   forming an insulating film on the floating gate electrode.

3. The method for manufacturing a semiconductor memory device according to claim 2, wherein said step of forming the floating gate electrode comprises the steps of:
   supplying a material gas containing no impurities;
   further supplying a gas containing an impurity while supplying the material gas to continuously change the flow rate of the gas containing the impurity;
   stopping the supply of the gas containing the impurity; and
   stopping the supply of the material gas.

4. The method for manufacturing a semiconductor memory device according to claim 3, wherein the supply of gas containing the impurity is started, after the supply of the material gas is started and carried out for a predetermined time.

5. A semiconductor manufacturing apparatus for forming a floating gate electrode on a substrate comprising:
   a first supplying section for supplying a material gas containing no impurities;

a second supplying section for supplying a gas containing an impurity; and a control unit for controlling said first supplying section and said second supplying section, said control unit controlling said second supplying section to continuously change the flow rate of the gas containing the impurity from zero to a predetermined amount between upper and lower surfaces of the floating gate electrode when the floating gate electrode is formed.

6. The semiconductor manufacturing apparatus according to claim 5, wherein the material gas is $SiH_4$ gas, and the gas containing the impurity is $PH_3$ gas.

* * * * *